(12) United States Patent
Ozgur

(10) Patent No.: US 6,969,630 B2
(45) Date of Patent: Nov. 29, 2005

(54) METHOD OF MAKING AN INTEGRATED ELECTROMECHANICAL SWITCH AND TUNABLE CAPACITOR

(75) Inventor: Mehmet Ozgur, Oakton, VA (US)

(73) Assignee: Corporation for National Research Initiatives, Reston, VA (US)

( * ) Notice: Subject to any disclaimer, the term of this patent is extended or adjusted under 35 U.S.C. 154(b) by 0 days.

(21) Appl. No.: 10/663,983

(22) Filed: Sep. 17, 2003

(65) Prior Publication Data

US 2004/0097066 A1 May 20, 2004

Related U.S. Application Data

(62) Division of application No. 10/147,300, filed on May 17, 2002, now Pat. No. 6,800,912.
(60) Provisional application No. 60/291,423, filed on May 18, 2001.

(51) Int. Cl.[7] ............................................... H01L 21/00
(52) U.S. Cl. ..................... 438/53; 438/52; 257/E21.215
(58) Field of Search ........................... 438/52, 53, 393, 438/584, 977, FOR 430, FOR 220; 257/E21.215

(56) References Cited

U.S. PATENT DOCUMENTS

6,167,761 B1 * 1/2001 Hanzawa et al. .............. 73/724
6,418,006 B1 7/2002 Liu et al. ..................... 361/277

\* cited by examiner

*Primary Examiner*—George Fourson
*Assistant Examiner*—Thanh V. Pham
(74) *Attorney, Agent, or Firm*—Nixon & Vanderhye P.C.

(57) ABSTRACT

A monolithically integrated, electromechanical microwave switch, capable of handling signals from DC to millimeter-wave frequencies, and an integrated electromechanical tunable capacitor are described. Both electromechanical devices include movable beams actuated either by thermo-mechanical or by electrostatic forces. The devices are fabricated directly on finished silicon-based integrated circuit wafers, such as CMOS, BiCMOS or bipolar wafers. The movable beams are formed by selectively removing the supporting silicon underneath the thin films available in a silicon-based integrated circuit technology, which incorporates at least one polysilicon layer and two metallization layers. A cavity and a thick, low-loss metallization are used to form an electrode above the movable beam. A thick mechanical support layer is formed on regions where the cavity is located, or substrate is bulk-micro-machined, i.e., etched.

16 Claims, 13 Drawing Sheets

METHOD OF MAKING AN INTEGRATED ELECTROMECHANICAL SWITCH AND TUNABLE CAPACITOR

This application is a divisional of application Ser. No. 10/147,300, filed May 17, 2002 now U.S. Pat. No. 6,800,912, which claims the benefit of Provisional Application No. 60/291,423, filed May 18, 2001, the entire contents of which are hereby incorporated by reference in this application.

FIELD OF THE INVENTION

The present invention relates generally to tunable and re-configurable microwave systems, and, in particular, to the fabrication of re-configurable silicon-based integrated circuits, with integrated electromechanical switches and capacitors.

BACKGROUND OF THE INVENTION

Microelectromechanical switches (MEMS) have been shown to have very low losses at very high frequencies. Compared to traditional active microwave switches based on transistors or diodes, the quality factors (i.e., $1/R_{on} C_{off}$, where $R_{on}$ is the resistance of the switch in the ON-state and $C_{off}$ is the capacitance in the OFF-state) of MEMS switches are very high. Therefore, MEMS microwave components are suitable for in many types of applications.

High quality MEMS switches enable the construction of electrical systems with greatly improved functionality and flexibility. Such systems can be electrically re-configured to perform many different electrical functions without a loss of significant operating quality. However, if the electromechanical switches, control circuitry for the switches, and conductive traces among which the electrical reconfiguration is done are fabricated on different substrates, such benefits would not be as significant. Monolithic fabrication is very important for achieving the quality, reliability, functionality, and low-cost of such MEMS systems.

SUMMARY OF THE INVENTION

The present invention is directed to a low-loss microelectromechanical microwave switch and a microelectromechanical tunable capacitor monolithically integrated with low-cost silicon-based integrated circuits. The microwave switch of the present invention is capable of handling signals from DC to millimeter-wave frequencies. Both the switch and tunable capacitor include movable beams actuated either by thermo-mechanical or electrostatic forces. The movable beams are formed by selectively removing the supporting silicon underneath the thin films available in a silicon-based integrated circuit technology, which incorporates at least one polysilicon layer and two metallization layers. A cavity and a thick, low-loss metallization layer are used to form an electrode above the movable beam. A thick mechanical support layer is formed in regions where the cavity is located, or the substrate is bulk-micromachined (i.e., etched).

The devices are fabricated directly on finished silicon-based integrated circuit wafers, such as CMOS, BiCMOS or bipolar wafers. The present invention uses monolithic integration wherein the MEMS devices are connected to the integrated circuits necessary to control their operation, the integrated circuits being on the same substrate as the MEMS devices they control. In the present invention, this processing is performed on non-active circuit areas, i.e., where "passive" components, such as resistors, capacitors, inductors, interconnections, etc. are located. The functions and operation characteristics of active circuits do not change as a results of the process sequence of the present invention.

Reconfiguration capability is an advantage of the MEMS-IC integration of the present invention. For example, a frequency selective filter based on MEMS devices, such as MEMS switches and MEMS tunable capacitors and/or inductors allows the switches to switch-in (or out) selected passive component(s) to the circuit configuration of the filter. By switching in and out electrical components into the circuit configuration, the overall circuit can be changed. Thus, for example, a passive LC filter can be changed from low-pass filter to band-pass filter by switching-in a selected set of inductors and capacitors.

DESCRIPTION OF THE PREFERRED EMBODIMENT

Figure 1:
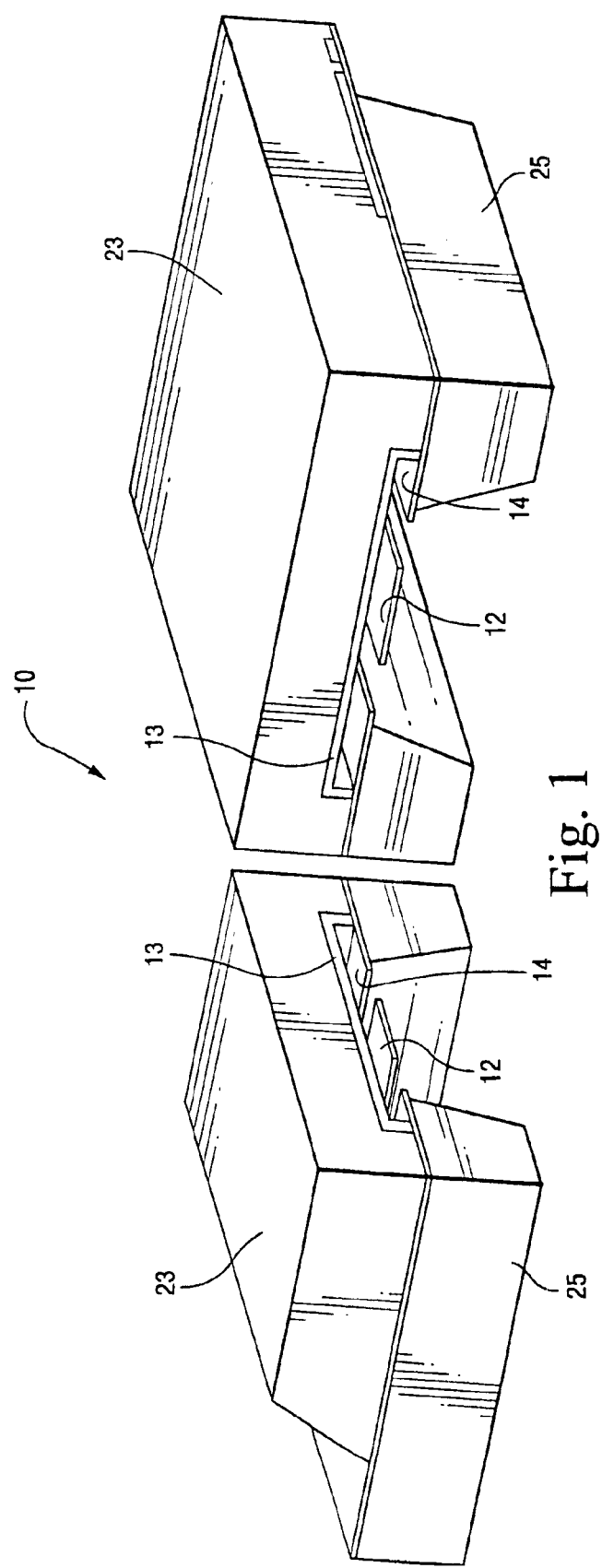
FIG. 1 shows two perspective views of two halves of a preferred embodiment of the electromechanical switch of the present invention, where the switch has been split open to show its internal construction.
Figure 2A:
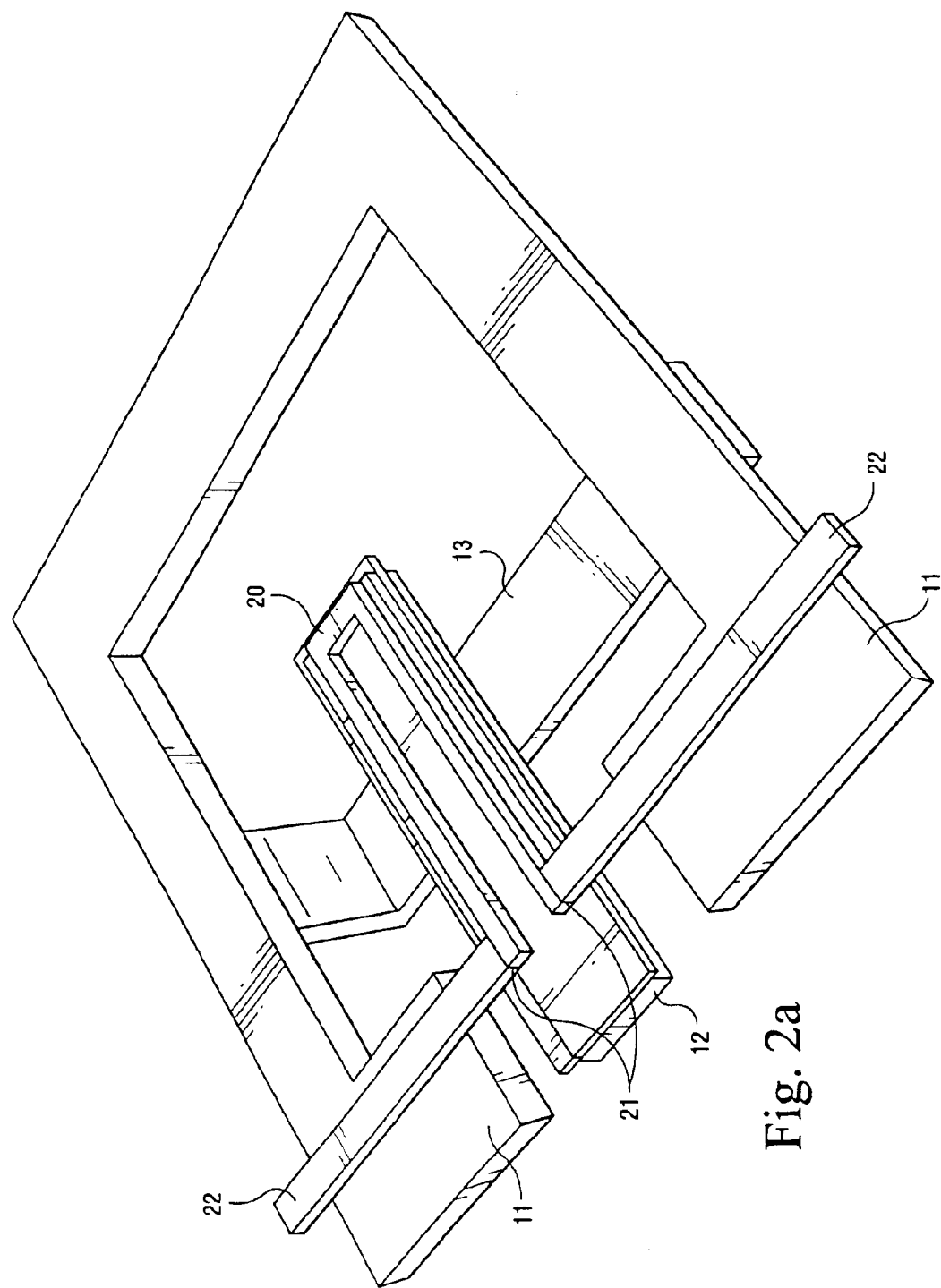
FIG. 2(a) is a perspective view of the bottom side of the electromechanical switch shown in FIG. 1, where the substrate and superstrate mechanical support layers are not shown for ease in understanding the operation of the switch.
Figure 4:
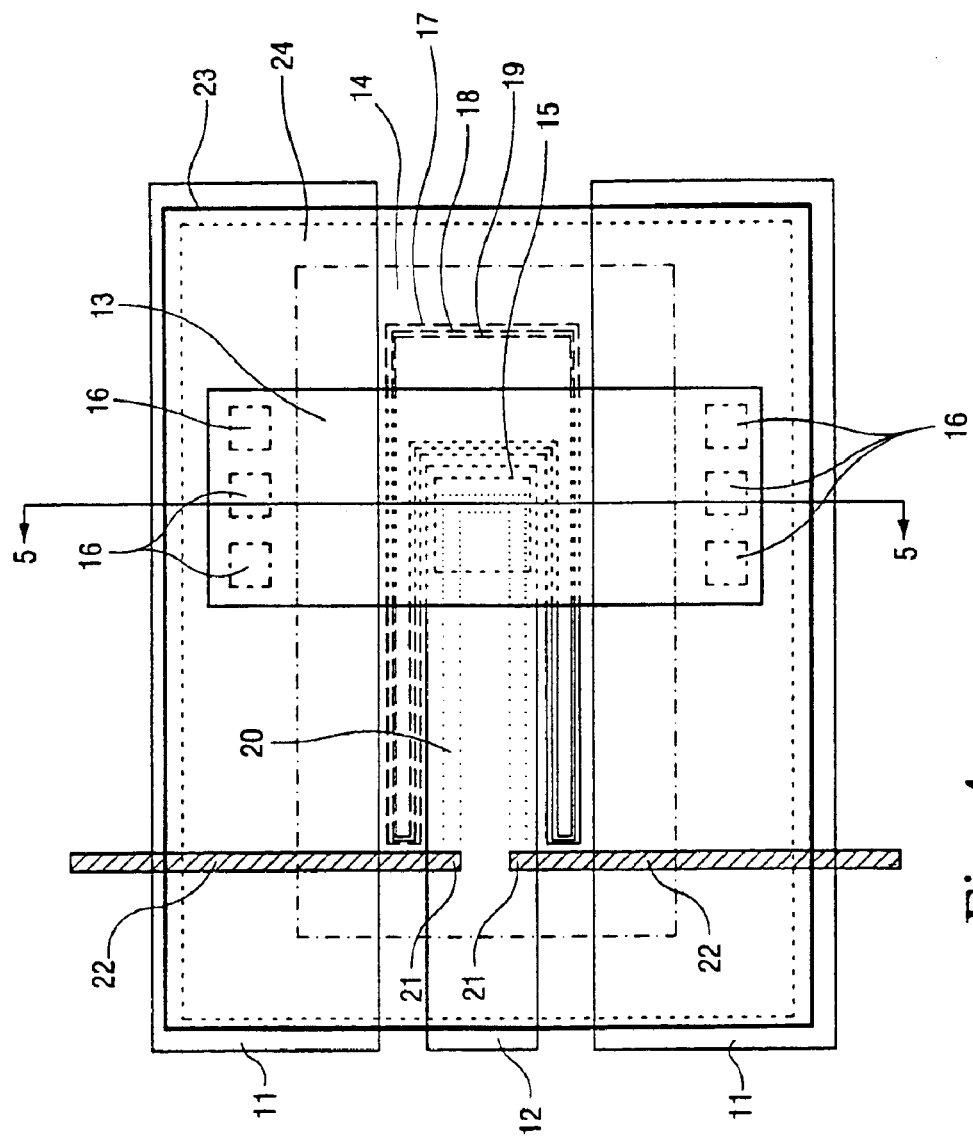
FIG. 4 is a top plan view of the electromechanical switch shown in FIG. 1.
Figure 5:
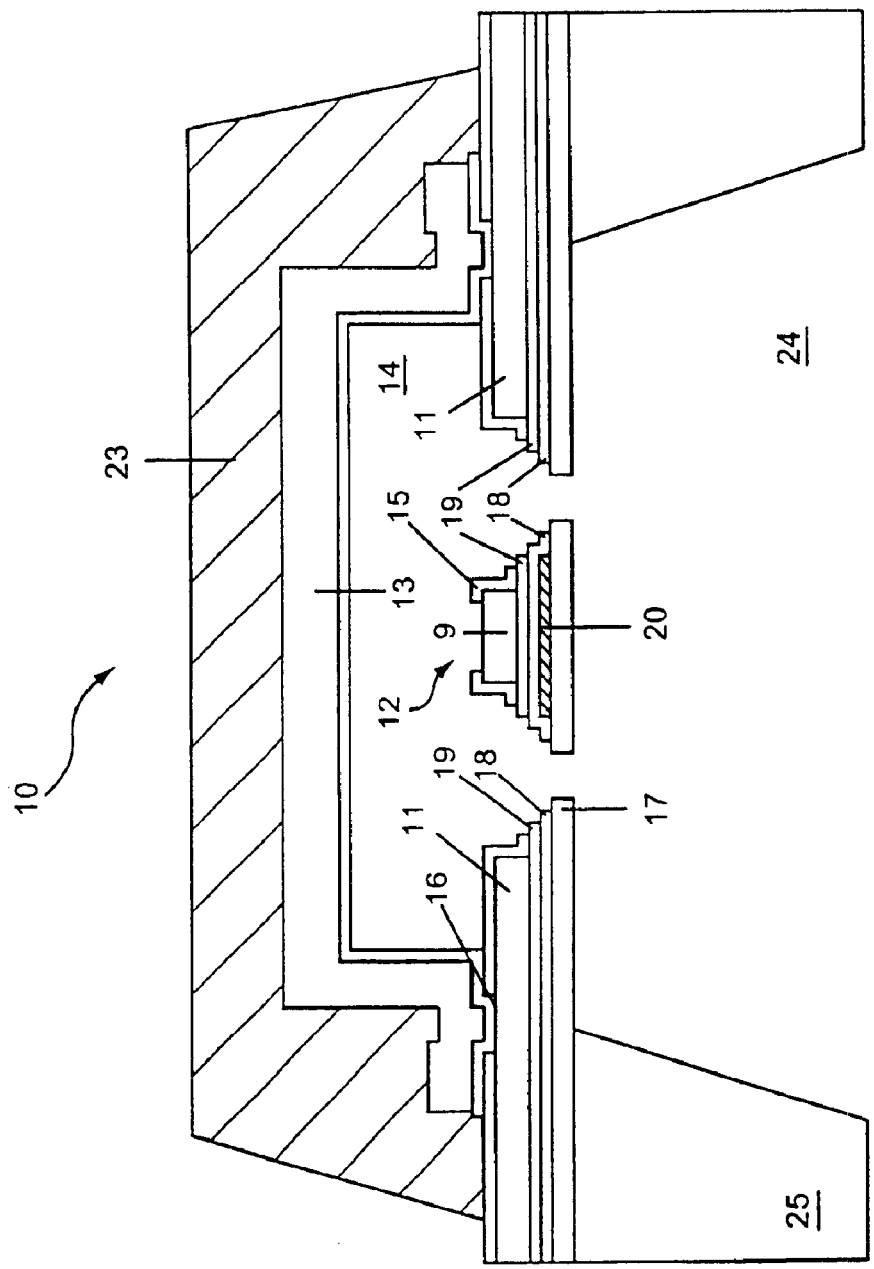
FIG. 5 is a cross-sectional view of an electromechanical switch shown in FIGS. 1 and 4 taken along the section line 5—5 shown in FIG. 4.

FIG. 1 is a perspective view of one embodiment of the electromechanical switch 10 of the present invention where switch 10 has been split open to show its internal construction. FIG. 4 is a top plan view of the electromechanical switch 10 in FIG. 1. FIG. 5 is a cross-sectional view of switch 10 taken along section line 5—5 shown in FIG. 4. Switch 10 is fabricated on a silicon wafer substrate 25, and includes a moveable beam 12 that moves within a cavity 14 to contact a conductive metal bridge 13. Deposited on top of substrate 25 is a superstrate 23 which supports conductive bridge 13. FIG. 2(a) is a bottom view of a thermally-actuated embodiment of switch 10, illustrated without the mechanical support layers, i.e., substrate 25 and superstrate 23, being shown for ease in understanding the operation of switch 10.

As shown in FIG. 2(a), switch 10 includes an n-shaped polysilicon heater 20 and two traces 22 that are formed in a first metal layer (not shown as before etching). Traces 22 provide power to heater 20 through connections 21. Above traces 22 are metal traces 11 and 9 which are deposited as part of a second level of metallization (also not shown as before etching). Traces 11 and 9 form microwave wave guides. Coplanar waveguides are preferred because the ground planes 11 are formed in the same plane as the signal plane 9. Deposited between these conducting layers are dielectric layers 17, 18 and 19, which function as insulating layers. Layer 17 is a field oxide layer, while layer 18 is an insulating layer between the first polysilicon layer and the first metal layer. Layer 19 is an insulating layer between the first metal layer and the second metal layer. Layer 15 is an insulating layer that covers the second metal layer. FIG. 5 shows a cross-sectional view of device formed using a one polysilicon layer and two metal layer CMOS process. The number of interconnection layers, i.e., metal layers, can be increased for more complex designs, such as modern CMOS processes that produce tens of millions of transistors in small areas which require as many as ten metal interconnection layers.

Moving beam 12 of MEMS switch 10 is formed using a thin-film deposited during IC fabrication. Moving beam 12 is a released layer, which, along with polysilicon heater 20, is fully released, except on one side. Deposited over second metal layer 11 and beam 12 is a dielectric layer 15 which functions as an insulating layer. Directly above beam 12 is a conductive bridge 13 formed using a third layer metallization 33 (see FIG. 6(g)), which is deposited as a part of the fabrication sequence described in FIGS. 6(a) to 6(i). Conductive bridge 13 is electrically connected to ground plane 11 through a plurality of cuts 16 in insulating layer 15. Bridge 13 is connected to ground plane 11 to achieve a shunt switching function, i.e., the signal line 40 is connected and disconnected to ground plane 11 through bridge 13.

Beam 12 is mechanically free to move in a vertical direction. Because of internal mechanical stresses, beam 12 is typically curved away from the surface of the silicon wafer 25 towards bridge 13. However, when beam 12 is heated by applying voltage across the polysilicon heater 20 embedded in beam 12, the curvature of beam 12 changes.

Figure 3:
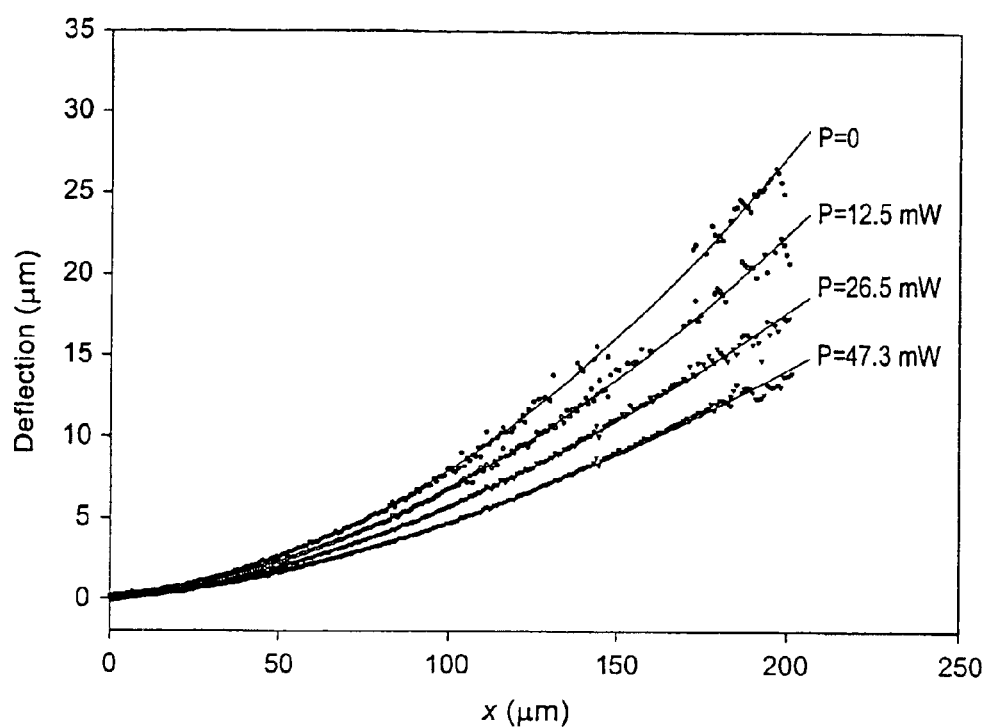
FIG. 3 is a graph showing deflection data for cantilever beams, such as that used in the present invention.

Data depicting the deflection of a cantilever beam, such as beam 12, is shown in FIG. 3. The data shown in FIG. 3 were taken using a non-contact interferometer system (not shown) at ambient room temperature and pressure. Curvature of a cantilever beam ultimately depends on the temperature profile along the beam. Temperature measurements taken along beam 12 show that the temperature profile along such beam is not constant. The temperature profile changes, depending on many factors, including local heat generation, local curvature (which is not constant), and ambient pressure (unforced air convection). Similarly, local heat generation along beam 12 depends on the local temperature and local grain structure in polysilicon heater 20. Despite the fact that the starting grain structure is fairly uniform across polysilicon heater 20, this uniformity is eventually lost. Nonlinear resistance behavior of polysilicon features is well-known for un-suspended polysilicon structures, but there are very few studies on suspended polysilicon structures, so more studies are needed to understand all important factors in determining the profile of a thermally-actuated beam. However, it is well-known that, once heat is generated, the tip of a cantilever, such as beam 12, can be controlled over large distances.

The fundamental effect that causes the change in the curvature of beam 12 is known as a bi-morph effect. It is the result of differences in thermal expansion coefficients between two materials. As shown in FIG. 4, a cantilever, such as beam 12, might contain many conducting (typically metal) and insulating layers (typically oxide). If a commonly available IC process is used, the metal layers would be Aluminum, while the insulation layers would be silicon dioxide. As beam 12 is heated, the metal pieces expand much faster than the insulating layers, thereby decreasing the beam curvature.

Thus, the basis for the operation of microwave switch 10 is a bi-morph effect. The height of the air-bridge 13 is chosen, such that for a particular cantilever beam design (length, width, combinations of thin-films), in an un-powered state (electrically ON-state), the tip of beam 12 would contact metal bridge 13, so that the signal-line (not shown) is connected to ground plane 11. For example, for a 200 $\mu$m long beam, the data for which is shown in FIG. 3, the height of bridge 13 can be chosen to be 25 $\mu$m or less. Although it is possible to have metal-to-metal contact in this configuration, simply by increasing the contact area at the tip of beam 12, because of sticktion issues, in an unpowered state, the tip of beam 12 is designed to have metal-to-dielectric contact. (see the FIG. 5, the parts of 15 remaining on top of 9 will touch the bridge 13. In metal-to-metal contact there won't be such dielectric pieces on top above 9.)

In addition, because of manufacturability issues, it is preferred to have bridge heights of less than 15 $\mu$m. The basic consideration involves the determination of tolerable power dissipation at the powered state (electrically OFF-state, no connection between signal line and ground plane). The amount of actuation is determined by the power dissipation (equivalently generated heat) and the length of beam 12. Using the same power, larger deflections can be obtained at the tip of longer beams, such as beam 12.

Another issue, which must be considered for the design of switch 10 is the ON-state and OFF-state capacitance ratio of switch 10. It is desirable to have high capacitance ratios, for example 100:1, to assure lower loss in the ON-state and high-isolation in the OFF-state. ON-state capacitance can be increased by increasing the contact area, increasing the dielectric constant of the material between metal layers in contact areas and decreasing the thickness of the dielectric layer. As discussed above, if desired, it is possible to design the contact area (15 in FIG. 4 shows the contact area) between beam 12 and bridge 13 to have metal-to-metal contact. On the other hand, OFF-state capacitance depends on the separation of contact surfaces and the area of contact surface. It is preferable to have as much separation as possible in the OFF-state, but the amount of separation is limited by available power, length of beam and fabrication limits.

Switch 10 can also be used as a tunable capacitor. Switch 10 provides a capacitance with a huge capacitance ratio. However, it should be pointed out that the cantilever architecture is more suitable for the binary operation of a switch, rather than the more demanding continuous operation of a tunable capacitor. A thermally actuated fixed-fixed beam is better for tunable capacitor applications.

Figure 2B:
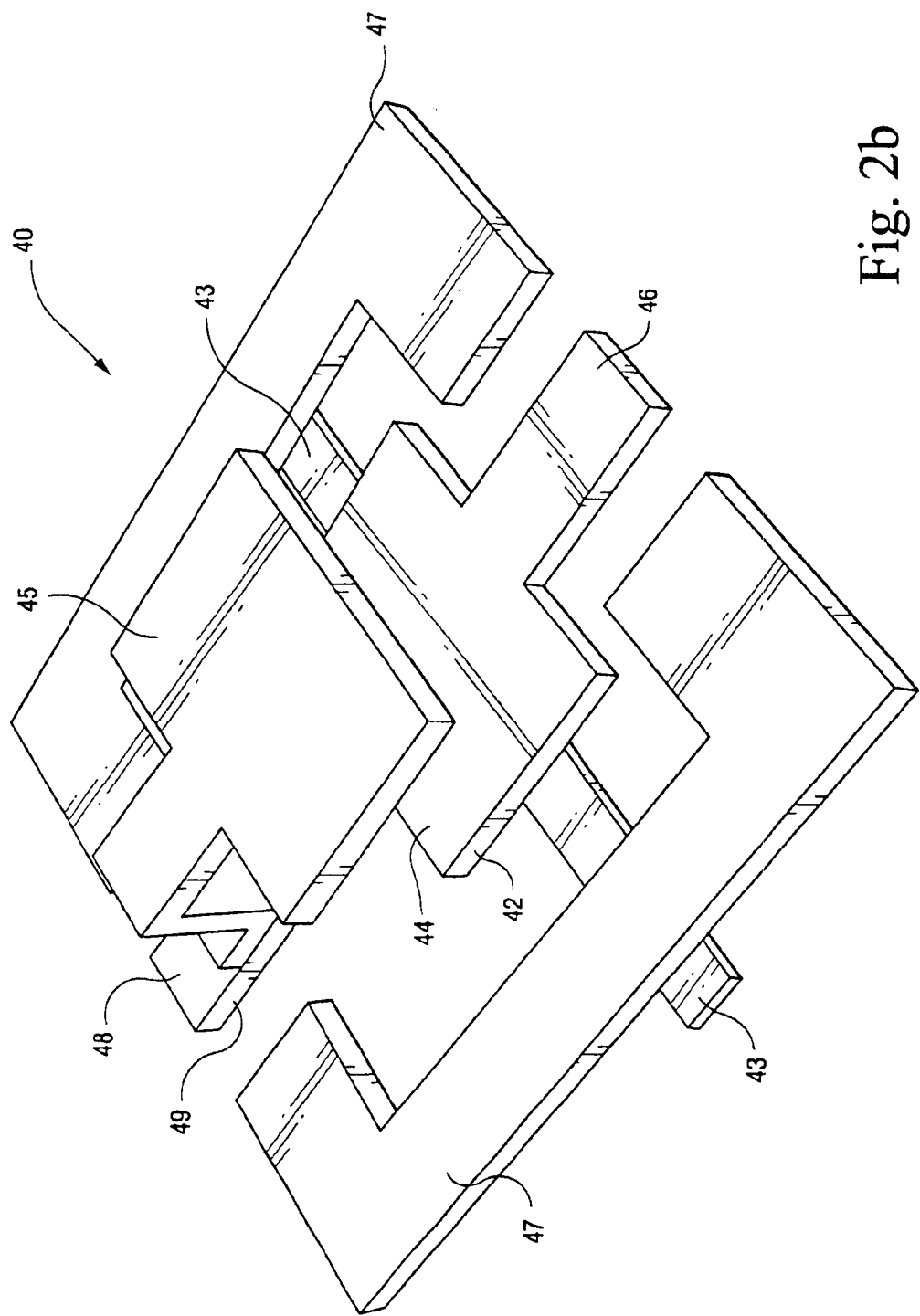
FIG. 2(b) is a perspective view of the top side of a preferred embodiment of the electromechanical tunable capacitor of the present invention, where the substrate and superstrate mechanical support layers are not shown for ease in understanding the operation of the switch.
Figure 2C:
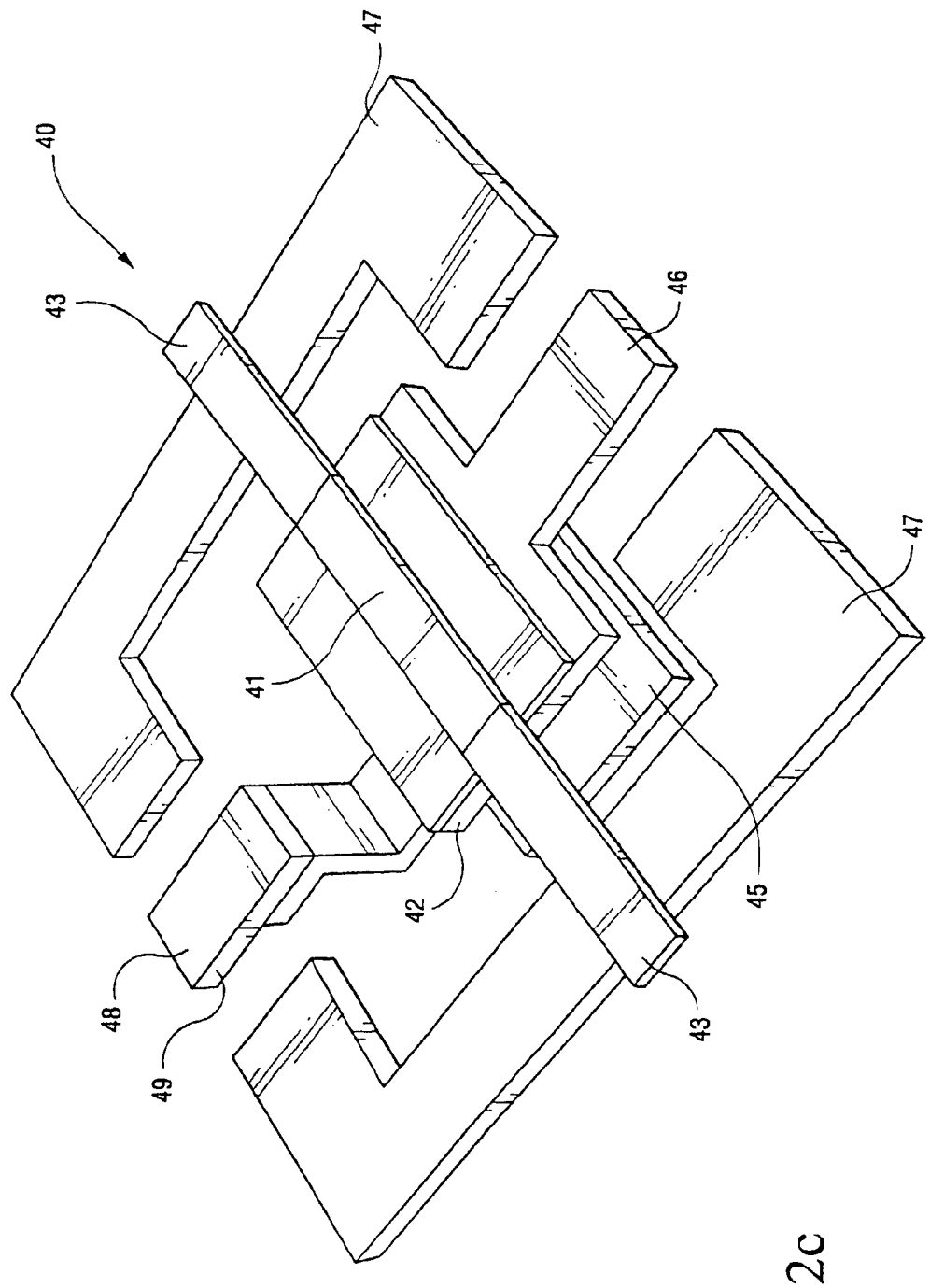
FIG. 2(c) is a perspective view of the bottom side of the electromechanical tunable capacitor shown in FIG. 2(b), where the substrate and superstrate mechanical support layers are not shown for ease in understanding the operation of the switch.

FIGS. 2b and 2c show the preferred embodiment of a series tunable capacitor 40 of the present invention, but without mechanical supports being illustrated.

A polysilicon heater 41 is employed at the backside of the lower plate 42, as shown in FIG. 2(c). The connections 43 to polysilicon heater 41 are formed using a first metal layer (again 43 is a part of the first metal layer). The variable capacitance is obtained between the second metal layer (top surface 44 of lower plate 42) and the third metal layer (45 shows the third metal layer), which forms the upper plate 45. Upper plate 45 is fixed, but lower plate on beam 42 can be actuated by using a bi-morph effect and polysilicon heater 41 buried within lower plate 42.

It should be noted that fixed-fixed beams can potentially buckle in both direction, i.e., into silicon or away from silicon. But, it has also been found that if a field-oxide layer is used, a very large percentage of fixed-fixed beams buckle away from silicon. A field-oxide layer (shown as 17 in FIG. 5) is a relatively thick thermally grown silicon dioxide layer which is under large compressive stress. If a field-oxide layer is incorporated into the beam structure of capacitor 40, it would lie directly on the surface (not shown) of silicon wafer 25. Therefore, once the beam 42 is released, it would be the bottom layer, i.e., field oxide layer 17 underneath beam 42. If this layer is omitted, special precautions must be taken to assure the buckling direction of beam 42. In this case, the desired direction is away from surface of silicon wafer 25, or towards the upper plate 45.

Inclusion of a field-oxide layer has some undesired effects as well. Since it is so thick and significantly increases the stiffness of beam 42, it also increases the power levels necessary to achieve desired capacitance ratio. When beam 42 buckles, it has a well-known raised cosine profile, but since it is not an ideal fixed-fixed beam, the real beam profile is fairly difficult to predict. This is especially true if beam 42 is much wider than polysilicon heater 41. The high frequency connection 46 to lower plate 42 can be changed from a straight connection, as shown FIG. 2(b) to connections to the edges. This would increase the reflection, but the thermo-electro-mechanical problem would become more manageable by simply assuming an ideal fixed-fixed beam.

The preferred capacitive embodiment of the present invention shown in FIGS. 2(b) and 2(c) uses a coplanar configuration. Ground planes 47 are formed using a second metal layer (not shown). Upper electrode 45 is fully supported by a mechanical support layer 48, and has a single electrical contact 49 to signal line of the output port (see FIG. 2(b)).

The capacitance of capacitor 40 is varied by changing the power dissipation in lower plate 42, whose maximum deflection decreases in response to increased heat from heater 41. The capacitance density also changes with the location of lower plate 42, since upper plate 45 remains flat as lower plate 42 develops a raised-cosine shape. The capacitance per unit length (measured in vertical direction to heater direction) is calculated in closed form. Maximum to minimum capacitance ratios higher than 10:1 and a quality factor of more than 50 can be achieved with this architecture.

Figure 2D:
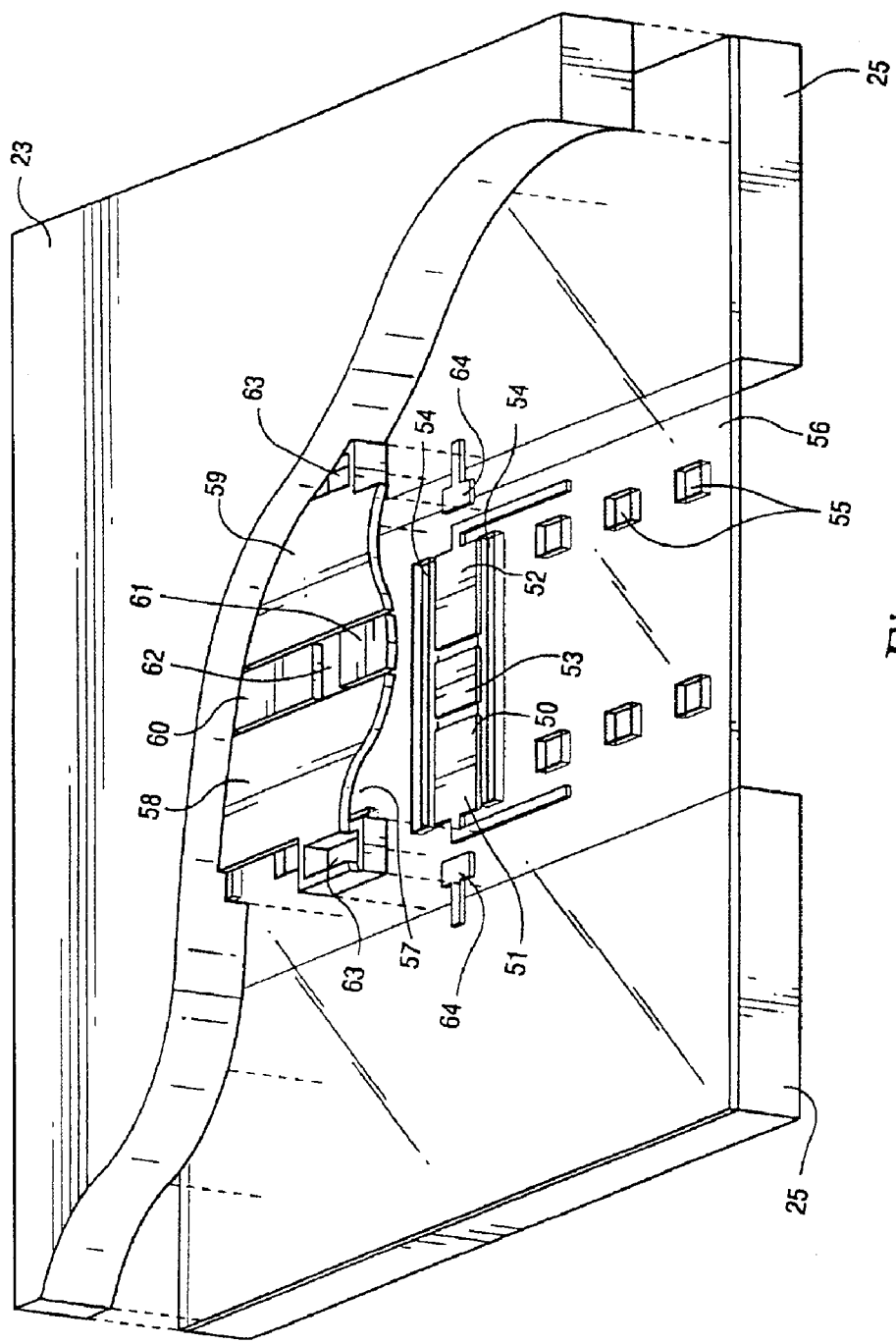
FIG. 2(d) is a perspective view of another embodiment of the electromechanical switch of the present invention using electrostatic actuation.

Although the switch and variable capacitor embodiments of the present invention shown in FIGS. 2(a) to 2(c) use thermal actuation, the present invention can also be implemented using electrostatic actuation. With electrostatic actuation, the third metal layer is kept fixed, while the moveable membrane is formed using layers available in a semiconductor process alone. A preferred embodiment of an electrostatically actuated shunt switch 50 according to the invention is shown in FIG. 2(d). The construction of the electrostatically actuated shunt switch 50 is generally the same as switch 10 shown in FIGS. 1 and 2(a), except as explained below.

A moveable beam 50 consists of at least three metal pieces, 51, 52, 53, formed on the second metal layer encapsulated in a membrane formed by inter-layer dielectric films. Metal pieces 51 and 52 are used for electrostatic actuation. They are connected to a voltage source (not shown) which is an integrated circuit located elsewhere on wafer 25. Metal piece 53 closes a gap 62 between two signal strips 60 and 61 directly above metal piece 53, once beam 50 is pulled-up by electrostatic actuation. Ideally, there is no dielectric on the surface of metal piece 53 so as to allow metal-to-metal contact between metal piece 53 and signal strips 60 and 61. To minimize sticktion, it is possible to add a thin layer of dielectric cover on metal piece 53. All three metal pieces, 51, 52 and 53 are typically encapsulated in dielectric films (typically oxide), but to allow free vertical motion of beam 50, metal piece 53 is isolated from an overlaying dielectric film membrane 56 by cuts in such film shown by openings 54. Additional etch-holes 55 in dielectric membrane 56 are added to facilitate the formation of a cavity 57.

A microwave waveguide is formed on third metal layer by using metal pieces, 58, 59, 60, and 61. Here again, such pieces form a coplanar waveguide configuration including ground planes 58 and 59 and signal planes 60 and 61. With gap 62 between signal planes 60 and 61, a signal cannot be transmitted. Ground planes 58 and 59 act as upper electrodes for electrostatic actuation. So, when a transmission through signal planes 60 and 61 is desired, beam 50 is pulled up by applying a voltage higher than the threshold voltage of the switch. Ground planes 58 and 59 are connected to circuit vias 63 and 64. These vias are formed as a part of third metal layer right above contact pads 64. Hence, circuit vias 63 and 64 are electrically connected to integrated circuits elsewhere on the wafer. Finally, ground planes 58 and 59 and signal planes 60 and 61 are supported by the mechanical support layer 23.

FIGS. 6(a) through 6(i) illustrate a preferred fabrication process for making the preferred embodiment of switch 10 of the present invention. This preferred process is based on semiconductor thin film deposition and photolithography processes, which are well known prior art. Other fabrication sequences which are obvious to those skilled in the art are also within the scope of the present invention.

The preferred embodiment of the electromechanical switch is fabricated using a semiconductor process in which a polysilicon layer, a first metal layer, and a second metal layer are deposited on a silicon wafer. By convention, in semiconductor processes, the layers are named according to their order of deposition. The first metal layer is the closest to the silicon substrate among metal layers, although it may be deposited on top of multiple layers of polysilicon. All the conductive layers are separated by insulating layers.

Figure 6A:
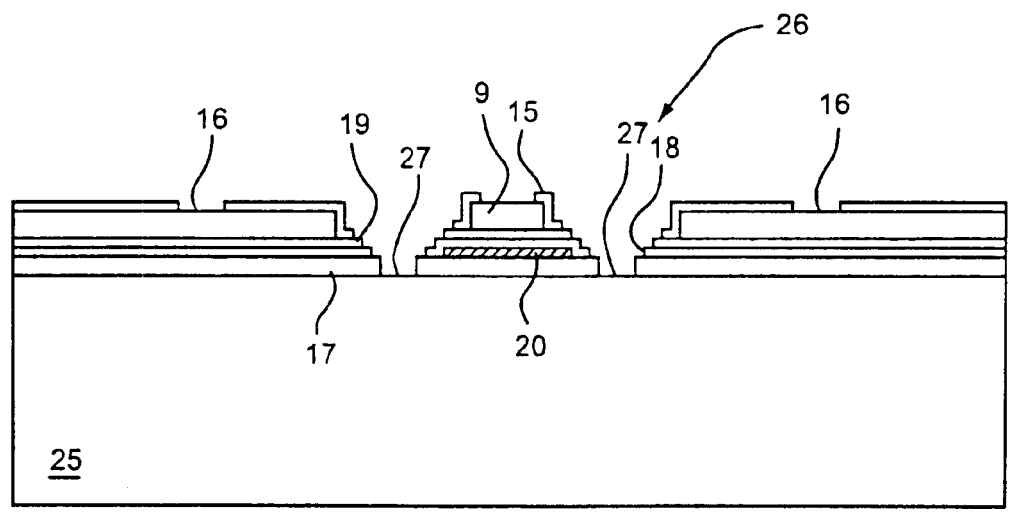
FIG. 6(a) is a cross-sectional view of the electromechanical switch of FIG. 4 taken along the section line 5—5 after a full, standard, single polysilicon, double metallization CMOS process sequence.

FIG. 6(a) shows a cross-sectional view of a completed semiconductor chip 26. For thermal actuation at least one polysilicon layer 20 is needed, but other, resistive layers, which are typically used to form resistors, can be used as well. In CMOS processing, substrate 25 is silicon, but with proper process changes at substrate at etch step, it is possible to fabricate similar devices on GaAs, SiC or other exotic substrate materials as well.

Another important consideration is the use of vias 27 (ie., cuts in insulating layers) in a given process technology. To increase yield, the IC design rules set by a given foundry may be very restrictive. It is essential to have the capability of dielectric stacked vias, which can directly expose substrate material for the fabrication sequence to be useful. Although there are several foundries allowing such via formations, typically, IC stacked vias are discouraged to improve the planarity of layers. If such vias are not allowed in an IC process, an additional masking layer is necessary to cut through the insulating layers 15, 17, 18 and 19 shown in FIG. 6(a).

Figure 6B:
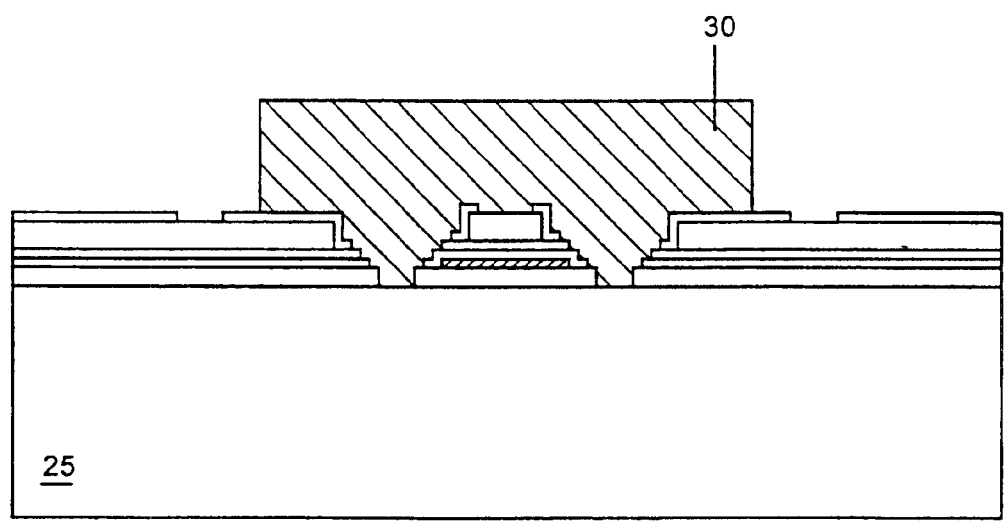
FIG. 6(b) is a cross-sectional view of the electromechanical switch of FIG. 4 taken along the section line 5—5 after deposition and patterning of the sacrificial film which defines an air-cavity in which the switch's beam moves.

In FIG. 6(b), a thick sacrificial layer 30 is patterned in area 14 (see FIG. 5), that defines the cavity which allows free movement of beam 12. The thickness of sacrificial layer 30 is determined by design requirements and fabrication limits. Photoresist, polymers and even metals can be used as sacrificial layer 30. It is preferable to use photosensitive materials which can be removed easily layer, therefore photoresists, especially thick varieties such as AZ 4600 series, AZ 9600 series, and Shipley 220 series can be used to achieve 3–20 $\mu$m thick features with fairly good aspect ratio. Since aspect ratio is not critical for this application, resist and regular contact lithography would also be acceptable for this step.

Figure 6C:
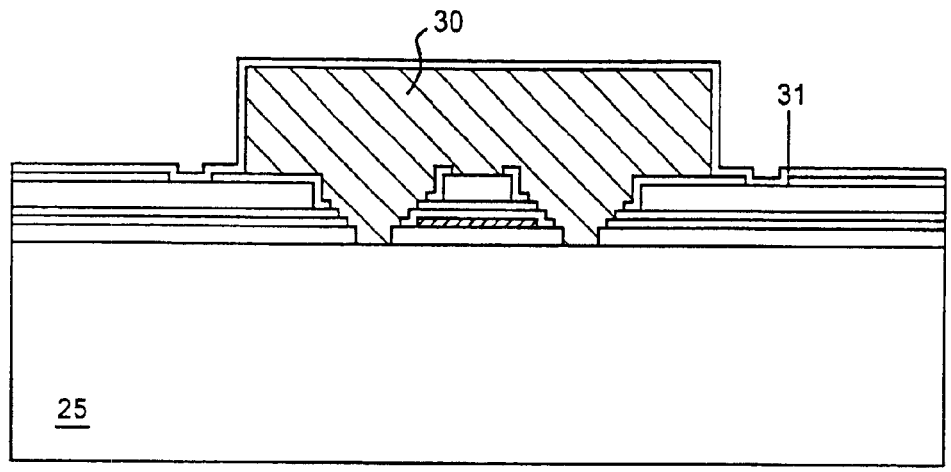
FIG. 6(c) is a cross-sectional view of the electromechanical switch of FIG. 4 taken along the section line 5—5 after deposition of the seed layer necessary for electro-deposition of thick conductive films.

FIG. 6(c) shows the next step of forming the mold necessary for electroplating. For this step, a seed layer 31 is deposited. Since gold is the preferred third metallization layer, seed layer 31 includes an adhesion and gold layer. A thin layer (100–300 A) of chromium or titanium can be used for this purpose. If desired, a stack of Cr/gold/Cr can be used to minimize any step coverage issues. Preferably, gold thickness is 1000 A–3000 A. Both of these materials 31 can be deposited using either evaporation or sputtering. Proper sputter clean-up should then be performed to remove native oxide in exposed surfaces of second level metal pads prior to seed layer deposition. This greatly improves contact resistance and repeatability.

Figure 6D:
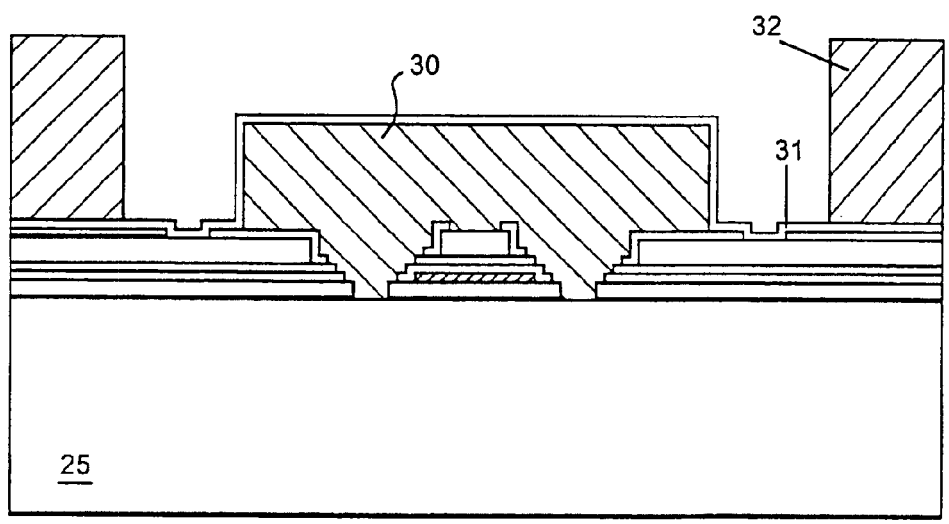
FIG. 6(d) is a cross-sectional view of the electromechanical switch of FIG. 4 taken along the section line 5—5 after deposition and patterning of a mold necessary for electro-deposition of thick conductive films.

As shown in FIG. 6(d), once seed layer 31 is deposited, a second layer of thick resist is used to form a mold 32 for subsequent gold plating. Again, the same variety of resists can be used to form mold 32. Minimum features should be larger than 5 $\mu$m at this step. Resist thickness should be more than the cavity height, to minimize lithography problems. Uniform resist thickness is hard to achieve by spin casting, but it is not necessary anyway. For 5 $\mu$m thick gold deposition, it would be preferable to have resist thickness of more than 5 $\mu$m. To lower cost, this sequence does not include any chemical-mechanical-polishing (CMP) step after gold deposition. It is also important not to overplate structures.

Figure 6E:
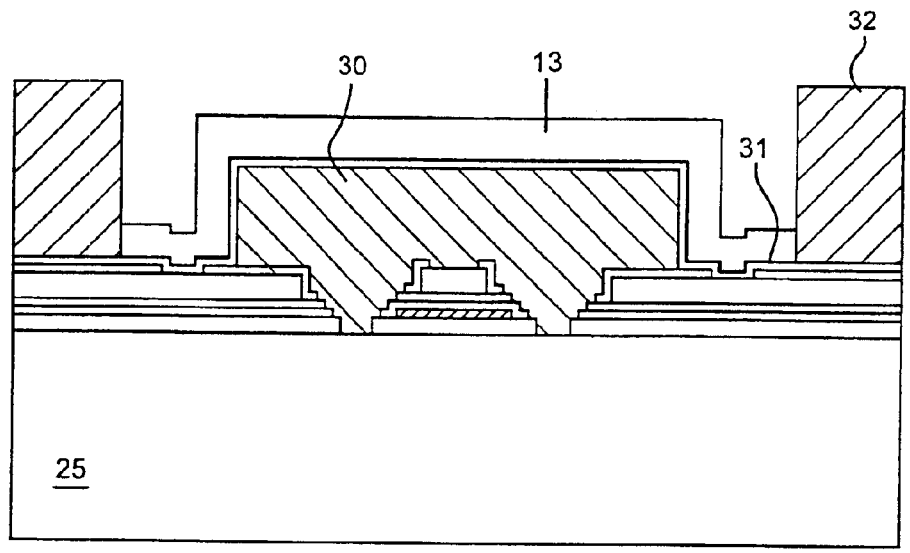
FIG. 6(e) is a cross-sectional view of the electromechanical switch of FIG. 4 taken along the section line 5—5 after electro-deposition of a thick conductive film.

In FIG. 6(e), about 5 $\mu$m thick gold is electroplated on wafer 25 through the exposed areas to form metal conductive bridge 13. This can be done using many available non-cyanide based gold plating solutions.

Figure 6F:
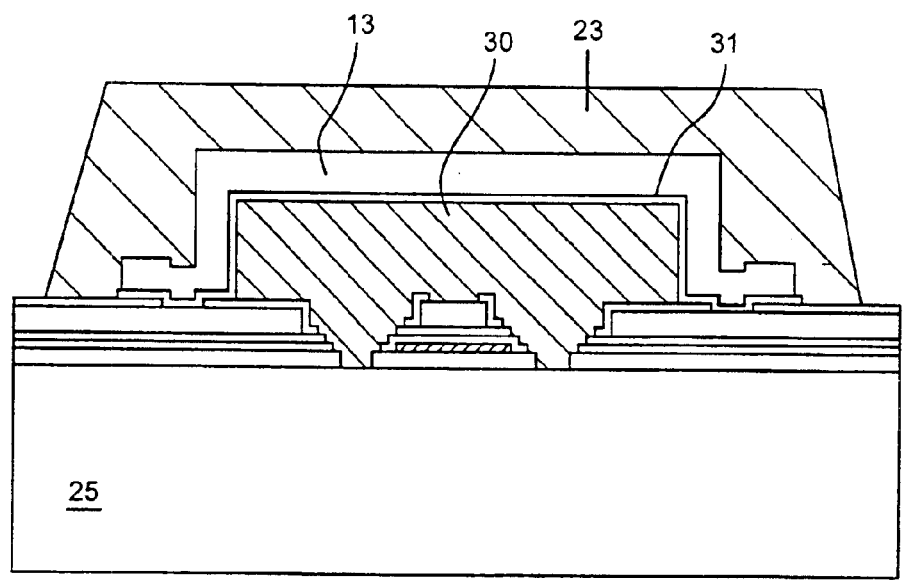
FIG. 6(f) is a cross-sectional view of the electromechanical switch of FIG. 4 taken along the section line 5—5 after deposition of non-conductive mechanical support layer before which the mold used during electro-deposition and the seed layer are removed.

The step shown in FIG. 6(f) consists of three minor steps. First, resist mold 32 is stripped, and then seed layer 31 is partially removed, since seed layer 31 can not be removed under bridge 13. Preferably, both of these steps are done using dry etching systems. If cavity 14 is defined using another resist layer, it is important to assure that it is well covered during the resist mold 32 strip operation. Oxygen plasma is can be used to ash resist mold 32. Similarly, sputter etch can be used to strip metal seed layer 31.

Finally, a superstrate 23 is deposited on top of switch 10, as shown in FIGS. 4 and 5. Several different materials can be used for this purpose. Polyimides, such as Epo-Tek 600 or DuPont's Pyralin, can be screen-printed on this area. Several good alternatives are emerging from high density interconnect (HDI) area, especially photoimageable versions of sequentially build-up microvia organic substrates are very promising. Examples of such substrates include DuPont's dry film ViaLux 81, Vantico's liquid Probelec 81, Enthone's liquid Envision PDD 9015, MacDermid's liquid Macuvia-C, Shipley Royal's Aspire MultiPosit 2000 and DynaVia 2000. Most of these materials have glass transition temperatures less than 200° C. For better coverage, liquid ones are preferable, but it has been observed that steps as high as 20 $\mu$m can be covered very easily by dry film varieties as well. Typically, the thickness of these films can vary between 10 to 100 $\mu$m in a single coat. If the cavity cannot be stabilized mechanically in a single coat, as many coats as needed must be applied over the cavity area. Typically, for a cavity height of <20 $\mu$m, superstrate 23 height of 50 to 100 $\mu$m is enough. Finally, BCB (benzocyclobutene)-based polymers such as Dow Chemical's Cyclotene family can be used for this purpose as well. Compared to microvia dielectrics, BCB has lower loss at high frequencies (>1 GHz) and also lower dielectric constant (~2.7), but typically the film thickness is less than 10 $\mu$m per coat. Therefore, it would require more processing.

Figure 6G:
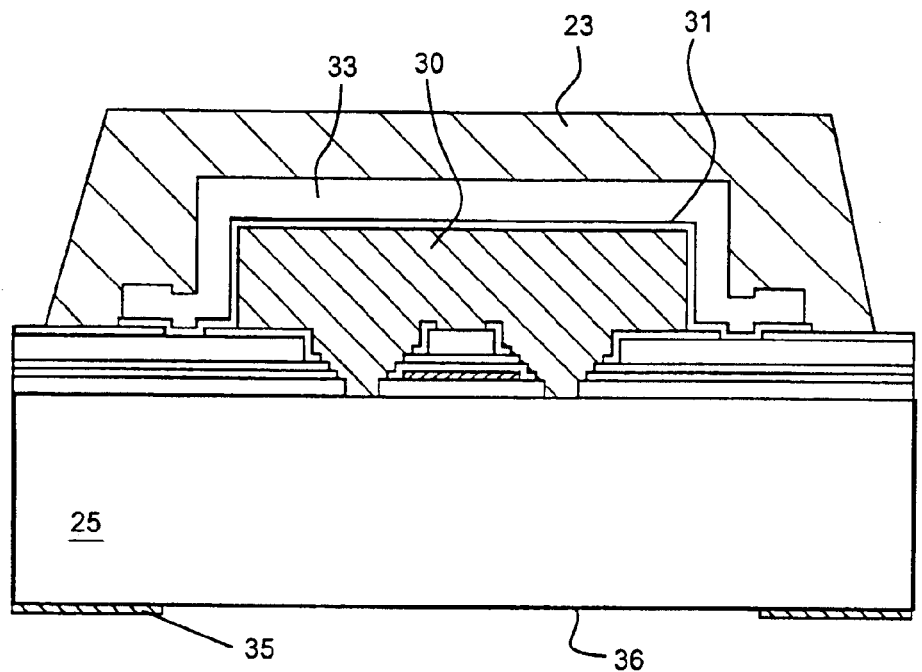
FIG. 6(g) is a cross-sectional view of the electromechanical switch of FIG. 4 taken along the section line 5—5, after deposition of a masking layer and patterning by front-to-back aligned lithography.

In FIG. 6(g), the backside 36 of substrate 25 is patterned to form a mask 35 by using front to back alignment to expose only the part of substrate 25, which needs to be removed from back 36. The front side of substrate 25 is also spray coated to minimize any interactions to with the etchant, such as XeF2.

Figure 6H:
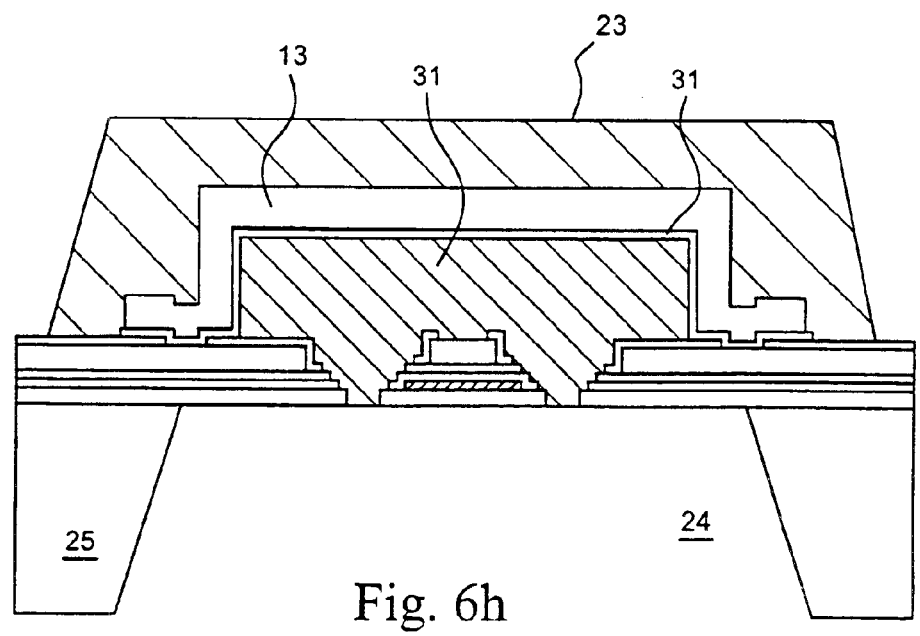
FIG. 6(h) is a cross-sectional view of the electromechanical switch of FIG. 4 taken along the section line 5—5, after selective removal of silicon substrate through the mask.

FIG. 6(h) shows selective removal of silicon substrate 25 from area 24 using mask 35. For silicon substrates, numerous etching techniques can be employed. The preferred approach is the use of pulsed XeF2 etch because of it is very high selectivity to silicon. XeF2 is an isotropic etchant. The etch surface gets rougher and less predictable as the etch goes on, therefore thinner substrates are preferable at this step. For substrates other than silicon, the etch technique must be changed accordingly.

Figure 6I:
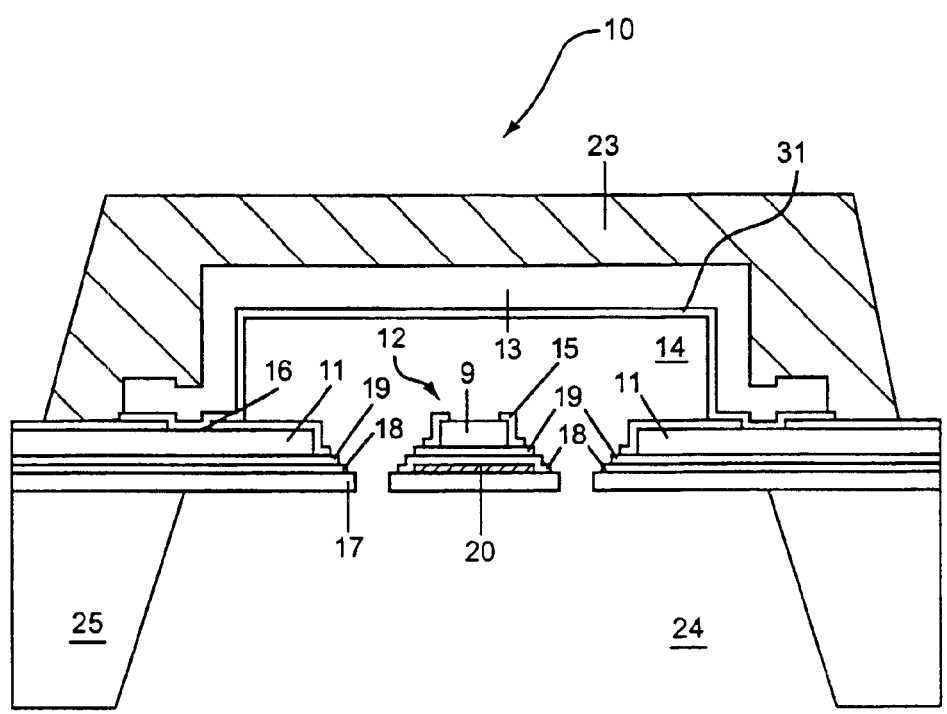
FIG. 6(i) is a cross-sectional view of the electromechanical switch of FIG. 4 taken along the section line 5—5, after removal of the sacrificial film which defines the air-cavity in which the switch's beam moves.

Finally, FIG. 6(i) is a cross-sectional view of electromechanical switch 10 after removal of the sacrificial film 30 which defines air-cavity 14. Once the silicon of substrate 25 is completely removed in the designated area 24, beam 12 is released by removing the photoresist 30 that fills cavity 14.

This can be done using a standard wet resist stripper application, followed by an oxygen plasma application to completely clean cavity 14. As cantilever beam 12 is released, it curves or buckles in cavity 14 so as to touch the third metal layer, bridge 13.

While the invention has been described in the context of a preferred embodiment, it will be apparent to those skilled in the art that numerous modifications may be made without departing from the true scope of the invention, leading to numerous alternative embodiments. Accordingly, it is intended by the appended claims to cover all modifications of the invention, which fall within the scope of the invention.

What is claimed is:

1. A method of forming an electromechanical device comprising the steps of:
    fabricating a first beam and an integrated circuit monolithically on a semiconductor substrate using standard semiconductor process flows;
    patterning above the first beam a sacrificial material;
    fabricating a second beam by performing the steps of:
        depositing a first conductive material on the sacrificial material by means of sputtering or evaporation;
        patterning a sacrificial mold for a second conductive layer;
        electrodepositing a thick second conductive layer over the mold;
        removing the sacrificial mold and an excess amount of the first conductive layer underneath the mold;
        depositing and patterning a mechanical support layer on top of the device;
    patterning and etching the semiconductor substrate from a backside of the substrate; and
    releasing the first beam so as to be movable by removing the sacrificial material on top of the first beam to form an air cavity above the first beam, the first beam being attached to the substrate at one or more points.

2. The method of forming a device as recited in claim 1, wherein the step of depositing the second conductive layer is followed by a step of polishing the conductive layer.

3. The method of forming a device as recited in claim 1, wherein the steps of depositing the first and second conductive layers are each repeated after a dielectric layer is deposited and patterned over each of the first and second conductive layers.

4. The method of forming a device as recited in claim 2, wherein the dielectric is a mechanical support layer.

5. The method of forming a device as recited in claim 1, wherein the substrate is selected from the group of semiconductor materials consisting of Si, SiGe and GaAs.

6. The method of forming a device as recited in claim 3, wherein the mechanical support layer is selected from the group consisting of screen-printed polyimide, a photoimageable polymer, and a dry-etchable polymer.

7. The method of forming a device as recited in claim 1, further comprising the step of forming a polysilicon heater in the movable beam for heating and thereby actuating the moveable beam.

8. The method of forming a device as recited in claim 1, wherein the first beam is fabricated from a plurality of conductive layers selected from the group consisting of polysilicon, aluminum and copper, and from a plurality of dielectric layers selected from the group consisting of doped silicon dioxide, undoped silicon dioxide, a form of silicon nitride, and a low-k dielectric.

9. The method of forming a device as recited in claim 1, wherein the second beam is fabricated from a plurality of conductive layers selected from the group consisting of gold, copper, silver, platinum, titanium, tungsten, aluminum, nickel, and alloys thereof.

10. The method of forming a device as recited in claim 1, wherein, the step of fabricating the first beam includes locating a conductive film at a contact area of the first beam, thereby allowing metal-to-metal contact between the first beam and the second beam.

11. The method of forming a device as recited in claim 1, wherein, the step of fabricating the first beam includes locating a dielectric film at a contact area of the first beam, thereby allowing metal-to-dielectric contact between the first beam and the second beam.

12. A method of forming an electromechanical device comprising the steps of:
    fabricating a moveable beam and an integrated circuit on a semiconductor substrate using standard semiconductor process flows;
    patterning an air-gap above the movable beam using a sacrificial material;
    fabricating a fixed beam by:
        depositing a thick conductive film on the sacrificial material by means of sputtering or evaporation;
        patterning the conductive film via standard photolithography; and
        etching the conductive film;
    depositing and patterning a mechanical support layer on top of an area covered by the device;
    patterning and etching the semiconductor substrate from a backside of the substrate; and
    releasing the moveable beam by removing the sacrificial layer placed on top of the moveable beam to form an air cavity above the first beam, the movable beam being attached to the substrate at one or more points.

13. The method of forming a device as recited in claim 12 further comprising the step of forming a polysilicon heater in the movable beam for heating and thereby actuating the moveable beam.

14. The method of forming a device as recited in claim 12 wherein, the step of fabricating the movable beam includes locating a conductive film at a contact area of the moveable beam, thereby allowing metal-to-metal contact between the movable beam and the fixed beam.

15. The method of forming a device as recited in claim 12 wherein, the step of fabricating the movable beam includes locating a dielectric film at a contact area of the moveable beam, thereby allowing metal-to-dielectric contact between the movable beam and the fixed beam.

16. The method of forming a device as recited in claim 12, wherein the mechanical support layer is selected from the group consisting of a screen-printed polyimide, a photoimageable polymer, and a dry-etchable polymers.

* * * * *

UNITED STATES PATENT AND TRADEMARK OFFICE
CERTIFICATE OF CORRECTION

PATENT NO. : 6,969,630 B2
DATED : November 29, 2005
INVENTOR(S) : Ozgur

It is certified that error appears in the above-identified patent and that said Letters Patent is hereby corrected as shown below:

<u>Title page,</u>
Item [75], Inventor, add -- Mehmet Ozgur, Oakton, VA (US); Mona Zaghloul; Bethesda, MD (US). --.

Signed and Sealed this

Twenty-fourth Day of January, 2006

JON W. DUDAS
*Director of the United States Patent and Trademark Office*